«12» United States Patent
Rao et al.

(10) Patent No.: US 8,294,607 B2
(45) Date of Patent: Oct. 23, 2012

(54) MULTICHANNEL DIGITIZER AND METHOD OF DIGITIZING

(75) Inventors: Naresh Kesavan Rao, Clifton Park, NY (US); Nanette Gruber, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 63 days.

(21) Appl. No.: 12/915,976

(22) Filed: Oct. 29, 2010

(65) Prior Publication Data

US 2012/0105262 A1 May 3, 2012

(51) Int. Cl.
*H03M 1/56* (2006.01)
(52) U.S. Cl. ........................ 341/169; 341/155
(58) Field of Classification Search .................. 341/169, 341/122, 155, 141, 166, 156, 167, 161, 162, 341/163
See application file for complete search history.

(56) References Cited

U.S. PATENT DOCUMENTS

| | | | | |
|---|---|---|---|---|
| 4,885,585 A | * | 12/1989 | Barrow et al. | 341/169 |
| 6,366,231 B1 | * | 4/2002 | Rao et al. | 341/166 |
| 6,940,345 B2 | * | 9/2005 | Nair et al. | 330/51 |
| 7,796,069 B2 | * | 9/2010 | Li | 341/122 |
| 2003/0071666 A1 | * | 4/2003 | Bailey | 327/131 |
| 2006/0164277 A1 | * | 7/2006 | Lee | 341/155 |
| 2009/0085784 A1 | * | 4/2009 | Di Giandomenico et al. | 341/141 |

* cited by examiner

*Primary Examiner* — Joseph Lauture
(74) *Attorney, Agent, or Firm* — Marie-Claire Maple

(57) ABSTRACT

A multichannel digitizer and method of digitizing are provided. One digitizer includes an analog to digital convertor (ADC) having a plurality of channels receiving input analog signals; an operational amplifier in each channel and a comparator connected to the operational amplifier. The ADC further includes a logic circuit in each channel connected to the comparator and configured to generate an output based on a comparator signal received from the comparator. The ADC also includes a ramp generator connected to the plurality of channels and configured to provide a time varying reference signal.

19 Claims, 8 Drawing Sheets

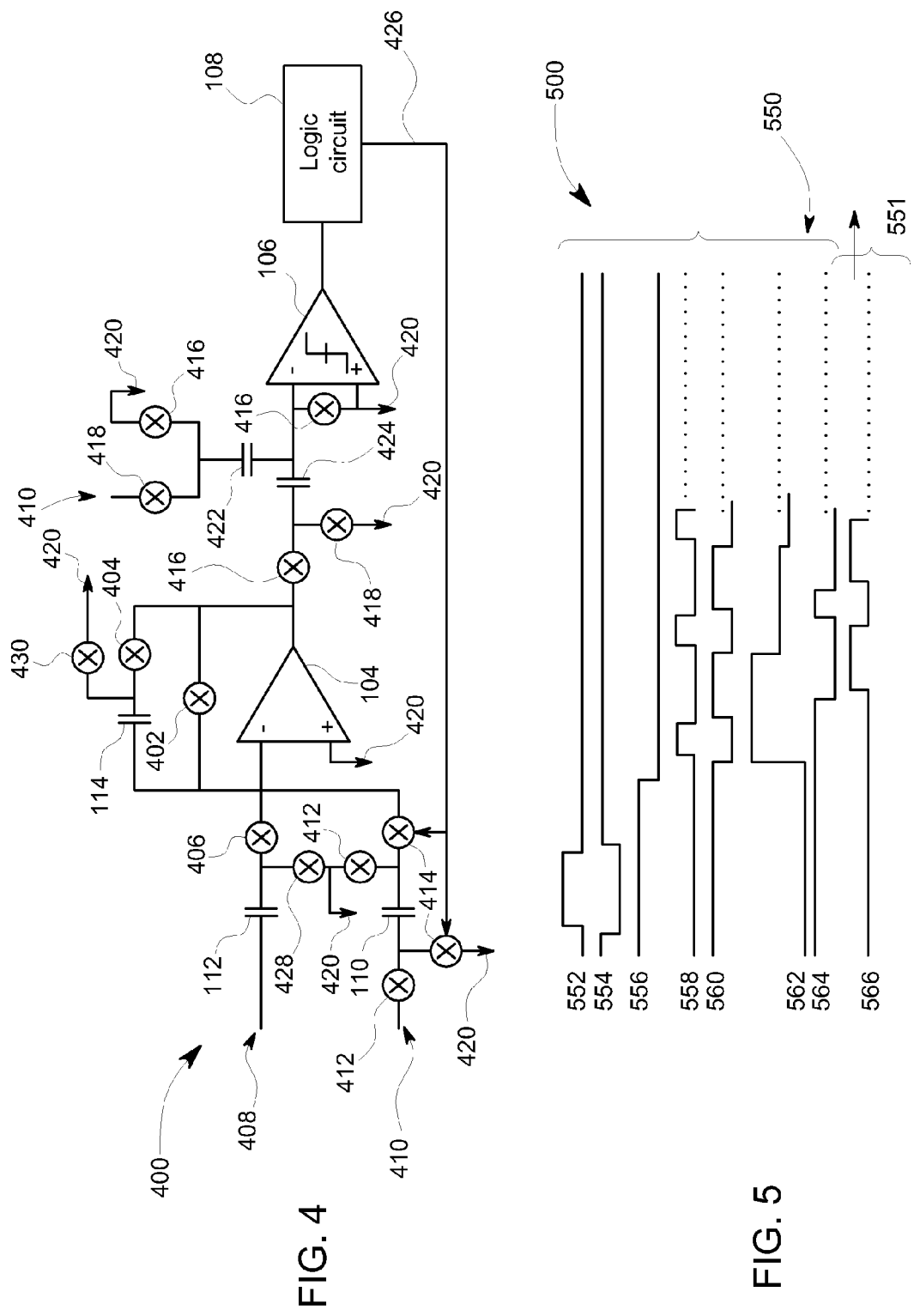

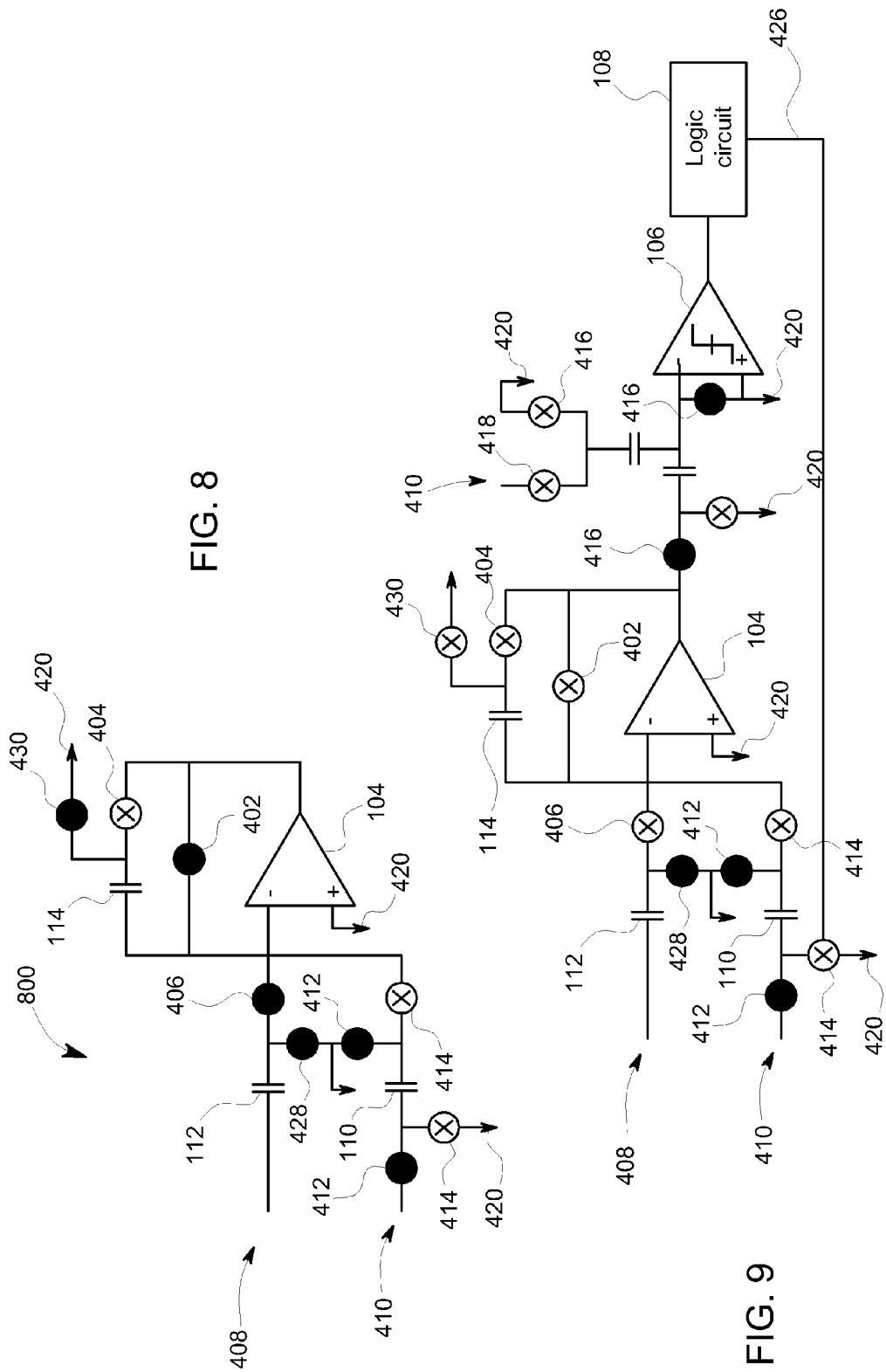

MULTICHANNEL DIGITIZER AND METHOD OF DIGITIZING

BACKGROUND OF THE INVENTION

The subject matter disclosed herein relates generally to electronic digitizers. More particularly, the subject matter disclosed herein relates to analog to digital converters (ADCs).

In many applications, such as diagnostic medical imaging, there is a need to simultaneously or concurrently convert multiple analog signals into respective digital values. For example, diagnostic medical imaging systems such as Computed Tomography (CT) systems, Digital X-Ray systems, Single Photon Emission Computed Tomography (SPECT) systems, and the like use digitization during image acquisition and/or reconstruction. Some of these medical imaging systems use 8 to 14 bit high speed multi-channel ADCs for digitization of acquired data.

Most conventional ADC's use a low noise, high precision comparator and a digital to analog converter (DAC), per channel. The DAC provides a ramp voltage that operates as a reference for sampled and held signals. The speed of an ADC is limited by the rate at which the ramp increases from a minimum signal to a maximum signal, ramp settling characteristics, and power usage for ramp buffers. Accordingly, the speed of the ADC limits the processing speed of the overall system, which can affect the overall performance of the system. Alternate ADC architectures have been proposed to overcome processing speed limitations. One such architecture involves using a DAC per channel along with a successive approximation register (SAR) algorithm. However, the use of the DAC per channel increases the size and power consumption of the ADC.

BRIEF DESCRIPTION OF THE INVENTION

In accordance with one embodiment, an analog to digital convertor (ADC) is provided that includes a plurality of channels receiving input analog signals, an operational amplifier in each channel and a comparator connected to the operational amplifier. The ADC further includes a logic circuit in each channel connected to the comparator and configured to generate an output based on a comparator signal received from the comparator. The ADC also includes a ramp generator connected to the plurality of channels and configured to provide a time varying reference signal.

In accordance with another embodiment, a method for converting an analog signal to a digital signal using an analog-to-digital converter is provided. The method includes receiving analog signals at a plurality of channels, sampling an input voltage signal in each channel from the input analog signal and holding the input voltage signal in each channel. The method further includes producing a time varying reference signal using a ramp generator for the plurality of channels, comparing the varying reference signal with the input analog signal and subtracting the varying reference signal from the input analog signal if the input analog signal is less than the reference signal. The method also includes storing the residue charge after subtraction.

BRIEF DESCRIPTION OF THE DRAWINGS

The drawings illustrate generally, by way of example, but not by way of limitation, various embodiments discussed in the present document. The subject matter disclosed may be described herein in terms of functional and/or logical block components and various processing steps. It should be appreciated that such block components may be realized by any number of hardware, software, and/or firmware components configured to perform the specified functions.

FIG. 4 illustrates a configuration for one of the channels in accordance with an embodiment.

FIG. 5 illustrates a relative timing of exemplary clock signals to control the operation of the ADC in accordance with an embodiment.

FIG. 8 illustrates the SHA in another state in accordance with an embodiment.

FIG. 9 illustrates the SHA in another state in accordance with an embodiment.

DETAILED DESCRIPTION OF THE INVENTION

The following detailed description is merely illustrative in nature and is not intended to limit the subject matter disclosed herein or the application and uses of the various embodiments of the subject matter described. Furthermore, there is no intention to be bound by any expressed or implied theory presented in the preceding technical field, background, brief summary or the following detailed description. In addition, those skilled in the art will appreciate that the subject matter disclosed herein may be practiced in conjunction with any number of applications and that the digitizers, including the analog to digital converter (ADC) architectures described herein are merely example applications for the subject matter disclosed herein.

As used herein, a "switch" means any internal or external reference point, connection point, junction, signal line, conductive element, or the like, at which a given signal, logic level, voltage, data pattern, current, or quantity is present. Furthermore, two or more switches may be realized by one physical element.

The following description also refers to switches or features being "connected" or "coupled" together. As used herein, unless expressly stated otherwise, switch "close" or "closed" refers to the state of the switch wherein that switch is in conducting state. The conducting state herein means a state of the switch where signal, voltage, current or any conductive element is allowed to flow from one point/node to another, in an electrical circuit, via the switch. As used herein, unless expressly stated otherwise, switch "open" or "opened" refers to the state of the switch where that switch is in a non-conducting state. The non-conducting state herein means a state of the switch where signal, voltage, current or any conductive element is not allowed to flow from one point/ node to another, in an electrical circuit, via the switch. For example, a switch may be "coupled" to a plurality of nodes, but all of those nodes need not always be "connected" to each other. Accordingly, the switch may connect different nodes to each other depending upon the state of the switch. Furthermore, although the various schematics shown herein depict certain example arrangements of elements, additional intervening elements, devices, features, or components may be present in an embodiment. Also, also a component may be referred to as a circuit, the component may be any type of device.

In the description that follows, like numerals or reference designators will be used to refer to like parts or elements throughout. Additionally, the terms "a" or "an" are used to include one or more than one.

In various embodiments, an ADC is provided and configured to process N bit conversions, where N can be any number. For example, the ADC may be 8 bit. Alternatively, the ADC may be of a 16 bit resolution.

Figure 1:
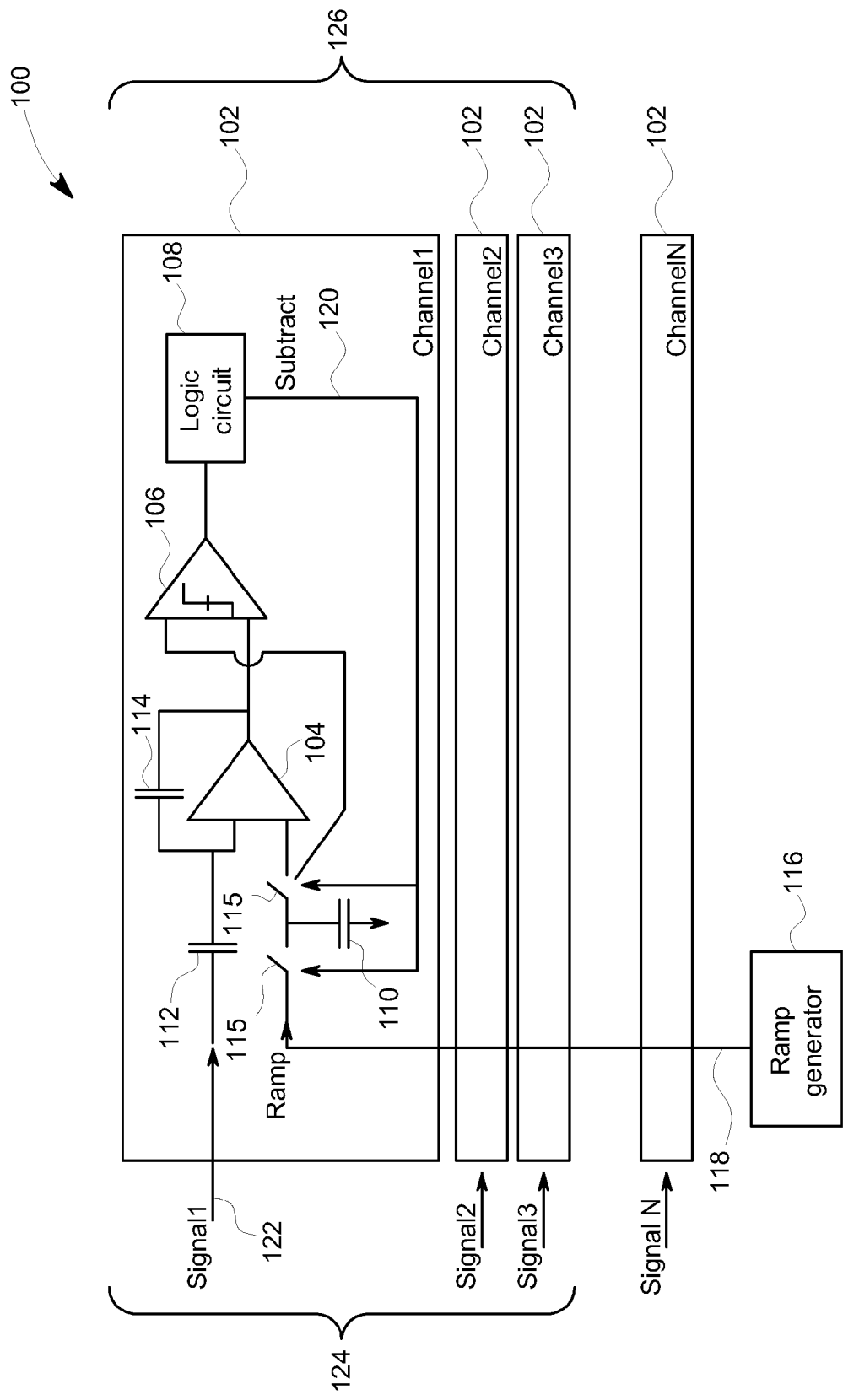
FIG. 1 illustrates a schematic representation of a multi-channel analog to digital converter (ADC) showing the components of one of the channels in accordance with an embodiment.

FIG. 1 illustrates a schematic representation of a multi-channel analog to digital converter (ADC) 100 showing the components of one of a plurality of channels 102 in accordance with an embodiment. The ADC 100 includes a plurality of separate channels 102 that may define a group of channels 126. For example, the number of channels 102 in the ADC 100 may be 1024. Although only one channel 102 is illustrated, each of the channels 102 may have similar components.

Each channel 102 of the ADC 100 includes an operational amplifier (OpAmp) 104, a comparator 106, a logic circuit 108, and a temporary store capacitor 110. The OpAmp 104 is connected between the input analog signal 122 and the comparator 106. The comparator 106 output is received by the logic circuit 108, where the logic circuit 108 provides a feedback 120 (via the illustrated feedback path) to the OpAmp 104, which is used to determine whether or not to perform a subtraction operation as described herein. Additionally, a single ramp generator 116 is connected to the plurality of channels 102 and is configured to provide a time varying reference signal. The charge from the ramp generator 116 is stored in the temporary store capacitor 110, which provides the reference voltage (Vref) to the OpAmp 104 and the comparator 106.

The OpAmp 104 in various embodiments operates to provide sample and hold operations, charge subtractions, and amplification. For example, the OpAmp 104 operates as an SHA circuit (hereafter also referred to as the SHA) to sample and hold the input analog signal. The OpAmp 104 also operates as a charge subtracting circuit that subtracts a reference signal from the sampled analog signal during a successive approximation register (SAR) operation. It should be noted that a feedback capacitor 114 holds a residue charge after subtraction operation. A counter (not shown) keeps or maintains count of the number of the particular subtraction operation being performed. Additionally, the OpAmp 104 operates to amplify the sampled analog signal and/or the residue signal, thereby providing an additional gain as part of the SAR operation.

Specifically, in various embodiments during SHA operation, the OpAmp 104 receives and/or captures an analog signal and holds the signal during a particular operation, which includes, for example, an analog-digital conversion.

The SHA operation includes two operational modes, which are a sample mode and a hold mode. When the SHA is in the sample (or track) mode, the output follows the input with only a small voltage offset. In the hold mode, a switch (not shown) between the input analog voltage and the capacitor 112 is opened, and the capacitor 112 retains the voltage present before the capacitor was disconnected from the input buffer. When the SHA is placed in the hold mode, all the bits of the SAR are reset to "0" except the most significant bit (MSB) which is set to "1". The SHA holds the sampled analog voltage until the completion of the SAR operation.

For example, the logic circuit 108, in each channel 102, which is connected to the comparator 106, is configured to generate an output based on a comparator signal received from the comparator 106. The logic circuit 108 sets the digital bit to '1' if the comparator signal Vsig is greater than Vref. Alternatively, the logic circuit 108 sets the digital bit to '0' if the comparator signal Vsig is less than Vref.

Feedback subtraction of the reference voltage form the analog sampled voltage forms the basic process used in the successive approximation. Feedback subtraction is performed using a charge subtracting operation performed using the OpAmp 104 and as described in more detail herein. In particular, a charge subtracting circuit subtracts a reference signal from the sampled analog signal during SAR operation. The output signal of the charge subtracting circuit is further stored in the feedback capacitor 114. In addition to holding residue charge after subtraction operation, the counter (not shown) keeps count of the residue operations performed.

Furthermore, the OpAmp 104 provides additional gain to the sampled analog signal and/or a residue signal as part of the SAR operation. The gain is calculated as the ratio of the charge stored in the capacitor 112 over the charge stored in the feedback capacitor 114.

Thus, in operation, the sampled input signal (Vsig) is compared to the reference voltage (Vref) in the comparator 106. One or more switches 115 may be provided to control the signal paths and transmission of Vref as described in more detail herein. It should be noted that a comparator offset does not affect overall linearity as this offset appears as an offset in the overall transfer characteristic. In addition, any suitable offset-cancellation technique may be applied to reduce the comparator offset. In some embodiments of the comparator 106, the input-referred noise is less than 1 LSB. Additionally, the comparator 106, in various embodiments, resolves voltages within the accuracy of the overall system; in other words, the comparator 106 is configured to be as accurate as the overall system.

A ramp generator 116, as described herein, is also provided and is a single reference voltage source to all of the channels 102. The ramp generator 116 produces a time varying reference voltage. For example, the time varying reference voltage may be a voltage that changes by a factor of two from the previous reference voltage, or other factor value. The reference voltage is provided to all of the channels 102 via a master bias channel 118. At any given time, during the SAR operation, the temporary store capacitor 110, in all channels 102, stores the same Vref voltage. The temporary store capacitor 110 provides the Vref voltage to the OpAmp 104 and the comparison capacitor 422 in the comparator 106. At the end of each bit comparison cycle, the temporary store capacitor 110 and the comparison capacitor 422 are discharged. The next reference voltage is then stored in the temporary store capacitor 110. After the MSB decision is completed, the cycle continues for the second bit, but with a new lower reference voltage. For example, the new voltage may be equal to one-half of the previous Vref (Vref/2). The digitization decision logic of the previous step is repeated and continues down to the LSB for the N-bit comparator.

For example, the successive approximation register is initialized so that the MSB is equal to a digital 1. If the sampled input signal is greater than the reference voltage, the logic advances and leaves the digital bit to '1'. The charge subtracting circuit subtracts Vref from Vsig in the OpAmp 104. However, if Vsig is less than Vref, a digital bit of '0' is recorded and the charge subtracting circuit does nothing. The residue signal in the OpAmp 104 at the end of this operation becomes the new Vsig signal. This new Vsig is then compared to the next varying Vref and so on.

Figure 2:
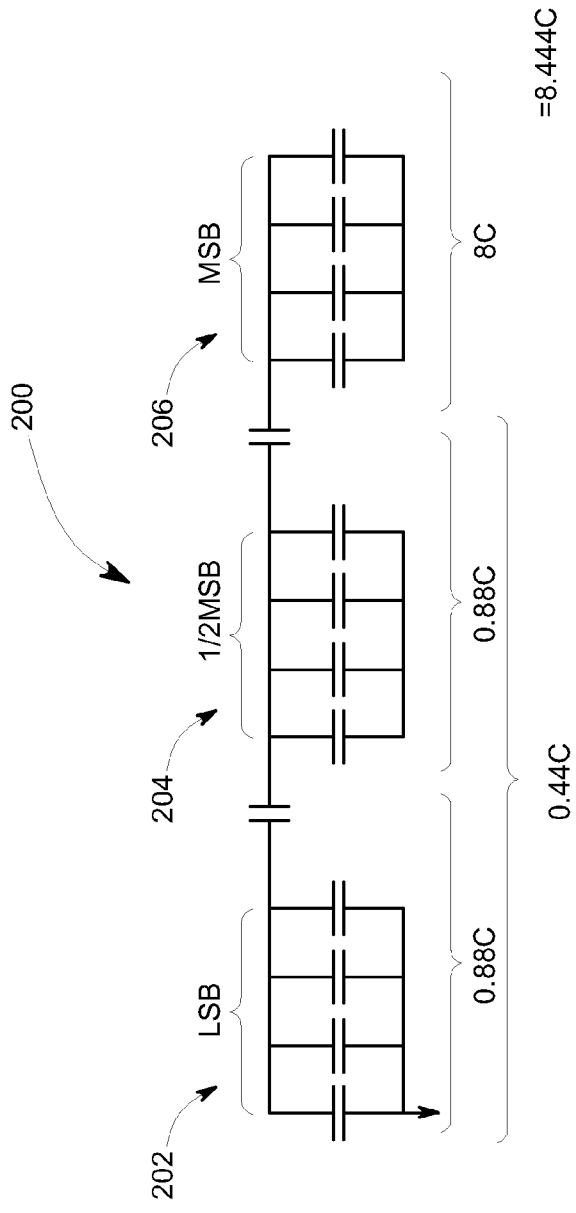
FIG. 2 illustrates a capacitor array based ramp generator in accordance with an embodiment.

In one embodiment, the ramp generator 116 can be a capacitor array 200. Thus, FIG. 2 illustrates a capacitor array 200 based ramp generator 116. It should be noted that a buffer OpAmp to drive the output of the capacitor array to all channels and the switches generating the time varying reference by connecting parts of the capacitor array to ground are not shown for simplicity. The ramp generator 116 in this embodiment, which may be a DAC, does not determine the difference between the signal and the reference The ramp generator 116 uses the capacitor array 200 to divide down the entire reference voltage.

In operation, the capacitor array 200 divides the maximum reference voltage from a maximum to a minimum reference voltage sequentially. For example, every next reference voltage may be a factor of two from the previous reference voltage. This stepping may be accomplished by connecting each capacitor group 202, 204 and 206 in the array to a ground or reference. Therefore, only one capacitor array 200 is used for all of the channels 102 to provide the voltage reference. For example, one capacitor array 200 is used for all 1024 channels. Thus, an external DAC is not provided in this embodiment. A single capacitor array 200 also reduces the power consumption of the ADC 100 and simplifies the design, and reduces the size of the ADC 100. Additionally, crosstalk in the ADC 100 may be reduced and calibration facilitated.

Figure 3:
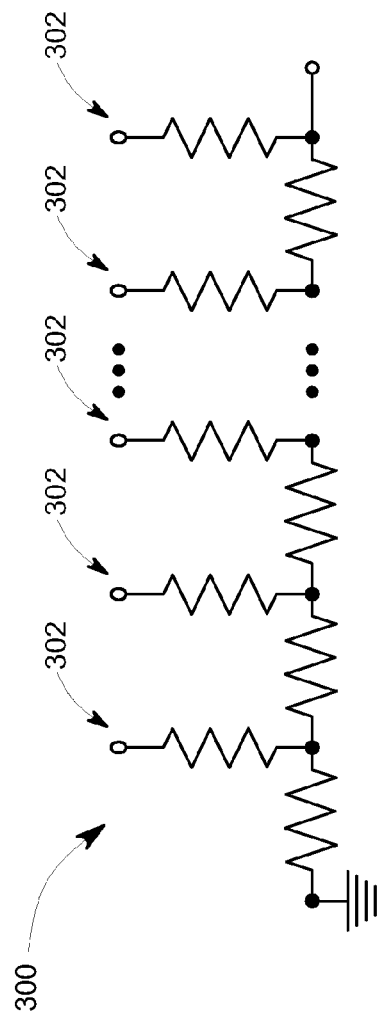
FIG. 3 illustrates a resistive ladder based ramp generator in accordance with an embodiment.

Alternatively, the ramp generator 116 may be a resistive ladder 300. Thus, FIG. 3 illustrates a resistive ladder 300 based ramp generator 116. It should be noted that a buffer OpAmp to drive the output of the resistive ladder 300 to all channels and the switches generating the time varying reference by connecting parts of the resistive ladder 300 to ground are not shown for simplicity. The resistive ladder 300 is an electrical circuit formed from repeating units of resistors 302. For example, the resistive ladder 300 may include a plurality of resistance elements 302 connected together in series. Additionally, multiple switches (not shown) may be provided in the resistive ladder 302. By operating these switches sequentially, with only one switch being closed at a time, a stepped ramp voltage may be obtained at the output. The resistors 302 act as a voltage divider between the referenced voltages, thereby generating a binary weighted ramp.

Optionally, the ramp generator may be a hybrid of the capacitor array 200 and the resistive ladder 300. For example, the ramp generator may combine the resistive ladder 300 for the MSBs and the binary-weighted principle for the LSBs. The selection may be based on, for example, design specifications, such as precision (by the use of the resistive ladder) and size, namely the number of resistive or current sources (by the use of the binary-weighted principle). For example, the resistive ladder 300 may be used for a large MSB, and the capacitor array 200 may be used for a smaller step size LSB. Thus, the SAR approach and the ramp based approach may be combined by using the SAR approach to yield all the MSBs and the ramp based approach to yield all the LSBs.

In one embodiment, the ADC 100 may operate according to the following to perform the SAR operation:

```
Vresidue = G.Vsig     (where G is gain of the S/H circuit)
For I=N down to 1     (where N is number of bits or ramp steps)
    If Vresidue(i−1) ≧ Vramp(i),
        Vresidue(i) = Vresidue (i−1) − Vramp(i);   (Ramp
        subtracted from Residue)
        D(i) = 1;          (Digital Bit set to '1')
    Elseif Vresidue(i)= Vresidue (i−1) ;
        D(i) = 0;   (Digital Bit set to '0')
    END
END
```

Thus, in operation a time varying reference voltage is generated in the master bias channel 118. This reference voltage is provided to all of the channels 102. If the sampled input analog signal is greater than the reference voltage, the SAR control logic 108 advances and sets the digital bit to '1'. The charge subtracting circuit n the OpAmp 104 subtracts the reference from the analog sample signal. If the input analog sample signal is less than the reference, a digital bit of '0' is recorded. The charge subtracting circuit then does nothing. The residue signal in the OpAmp 104 at the end of this operation becomes the new analog sample signal. The reference voltage is changed by a factor of two in the master bias channel and the previous step is repeated continuing down to the LSB of an N bit comparator until the digitization is completed.

FIGS. 4 through 12 illustrate the various states of the ADC 100 when performing digitization, in particular SAR operation. Specifically, FIG. 4 illustrates a configuration for one of the channels 102 in accordance with an embodiment. FIG. 4 depicts a SAR architecture 400 with all switches in an open position. In this state, all the clock signals are at a zero potential, thereby leaving the switches in a default open position. It should be noted that the operation of the ADC 100 input stage may be performed using any suitable input technique.

In another implementation of the SAR logic shown in FIG. 1, in FIG. 4, the capacitors precede the comparator 106. In this embodiment, for every clock cycle, the capacitor Cs 424 samples the residue of the previous clock cycle from the SHA. The capacitors, Cdac 422 and Cos 110, simultaneously or concurrently sample the new time varying reference voltage Vref. The comparator compares the charge stored in Cdac 422 and Cs 424.

In operation, initially the time varying reference voltage Vref starts at the MSB and with each cycle Vref progressively becomes smaller. A gain may be added to the residue to avoid very small time varying reference voltages. The gain may be calculated as a ratio of Cs 424 to Cdac 422. Alternatively, the residue voltage may be amplified by changing the gain either by redistributing charge in the feedback capacitor Cfb 114 or by changing the ratio of Cs 424 to Cdac 422.

The switches in the ADC 100 input stage may be controlled by the clock signals depicted in FIG. 5, with a clock signal generator providing the appropriate synchronizing signals for the ADC 100. The relative timing of the clock signals control the operation of the ADC 100, for example, as shown in FIG. 5. FIG. 5 shows different states of the clock signal on a channel 102 along a time axis from left to right. The switches in the ADC 100 are controlled by the clock signals and by switch control signals generated by logic circuit 108. When a clock signal 500 is high, the associated switch is closed, and when a clock signal 500 is low, the associated switch is open.

For example, when a clamp clock signal 552 is high and a track clock signal 554 is low, the clamp switch 402 is open and the track switch 404 is closed. In this operating state, Vref is stored onto Cdac 422 when the hold clock signal is high. Alternatively, when sample clock signal 558 is high Cdac 422 is discharged. Another implementation includes Vref applied to Cdac 422 when the sample clock signal 558 is high and Cdac 422 is discharged to ground when the hold clock signal 560 is high.

Figure 6:
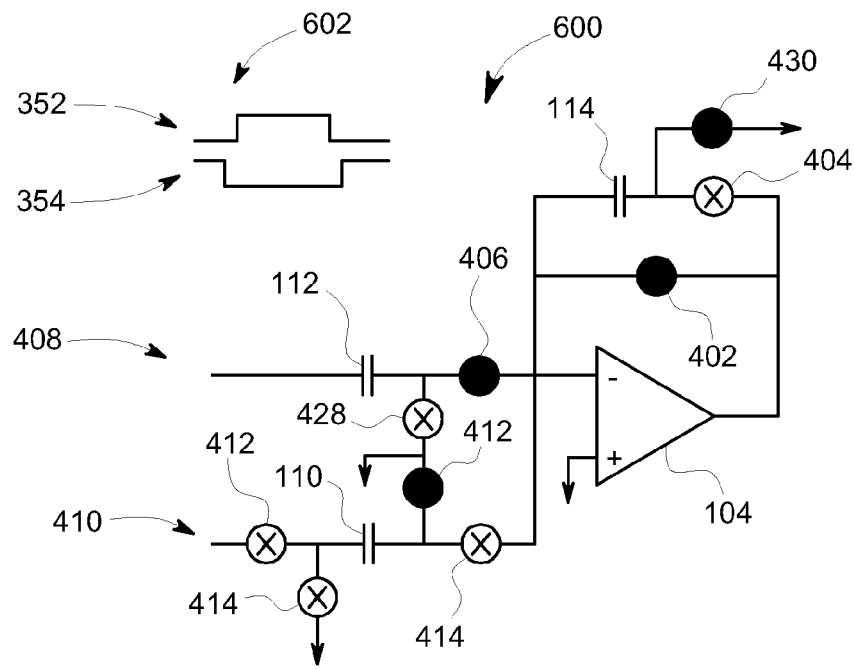
FIG. 6 illustrates a sample and hold circuit (SHA) in one state in accordance with an embodiment.

FIG. 6 illustrates SHA operation with a clamp switch 402 closed and a track switch 404 open in accordance with an embodiment. The operational state of the clock cycle for FIG. 6 is shown at 602. At 602, the clamp clock signal 552, S2 clock signal 556, and SubOSN clock signal 564 are high. Additionally, the track clock signal 554, and SubOS clock signal 566 are low. This clocking causes the clamp switch 402, S2 switch 406, and SubOSN switch 412 to close and the track switch 404 and SubOS 414 switches to open. In this state, the OpAmp 104 operates as a buffer and as a voltage-follower. Further, the input Vsig and Vref voltage at 602 is zero.

Figure 7:
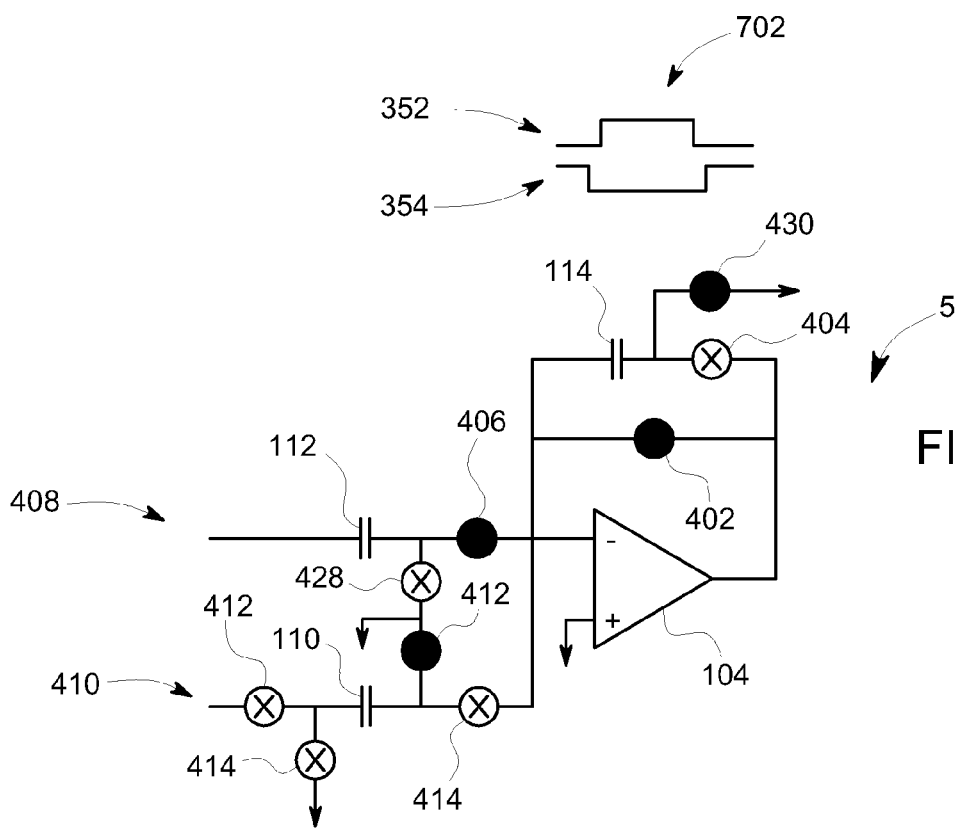
FIG. 7 illustrates the SHA in another state in accordance with an embodiment.

FIG. 7 illustrates SHA operation with the clamp switch 402 open and the track switch 404 closed in accordance with an embodiment. The operational state of the clock cycle for FIG. 7 is at 702. At 702, the track clock signal 554, S2 clock signal 556, and SubOSN clock signal 564 are high. Additionally, the clamp clock signal 552 and SubOS clock signal 566 are low. This clocking causes the clamp switch 402 to open and the track switch 404 to close. Further, the input analog signal (Vsig) is applied. In this state, the input analog signal Vsig is amplified, for example, where the ratio of capacitors Cdsa 112 and Cfb 114 represents the gain of the OpAmp 104. The amplified output voltage (Vo) is equal to the product of inverse Vsig and gain as follows:

$$Vo = -Vsig(Cdsa/Cfb)$$

FIG. 8 illustrates SHA operation with the S2 switch 406 in an open state in accordance with an embodiment. The clamp clock signal 552, S2N clock signal (not shown), and SubOSN clock signal 564 are high. Additionally, the track clock signal 554, S2 clock signal 556, and SubOS clock signal 566 are low. This clocking causes the switch S2 406 to open, allowing the Vsig 408 signal to be stored on to Cfb 114. Thus, the reference signal is stored. Furthermore, the reference voltage Vref 410 is applied to the OpAmp 104.

FIG. 9 illustrates SHA operation with a sample switch 416 open and the comparator 106 auto-zeroed in accordance with an embodiment. At 902, the track signal 554, clamp signal 552, and S2 signal 556 clock are at zero, therefore the respective switches are in the default (open) position. Additionally, the sample clock signal 558 is high and hold clock signal 560 is low, causing the sample switch 416 to close and hold switch 418 to open. This allows the capacitors Cdac 422 to charge up to the Vref 410 level. Further, the output of the OpAmp 104 is stored to Cs 424 and the comparator 106 is auto-zeroed (grounded).

Figure 10:
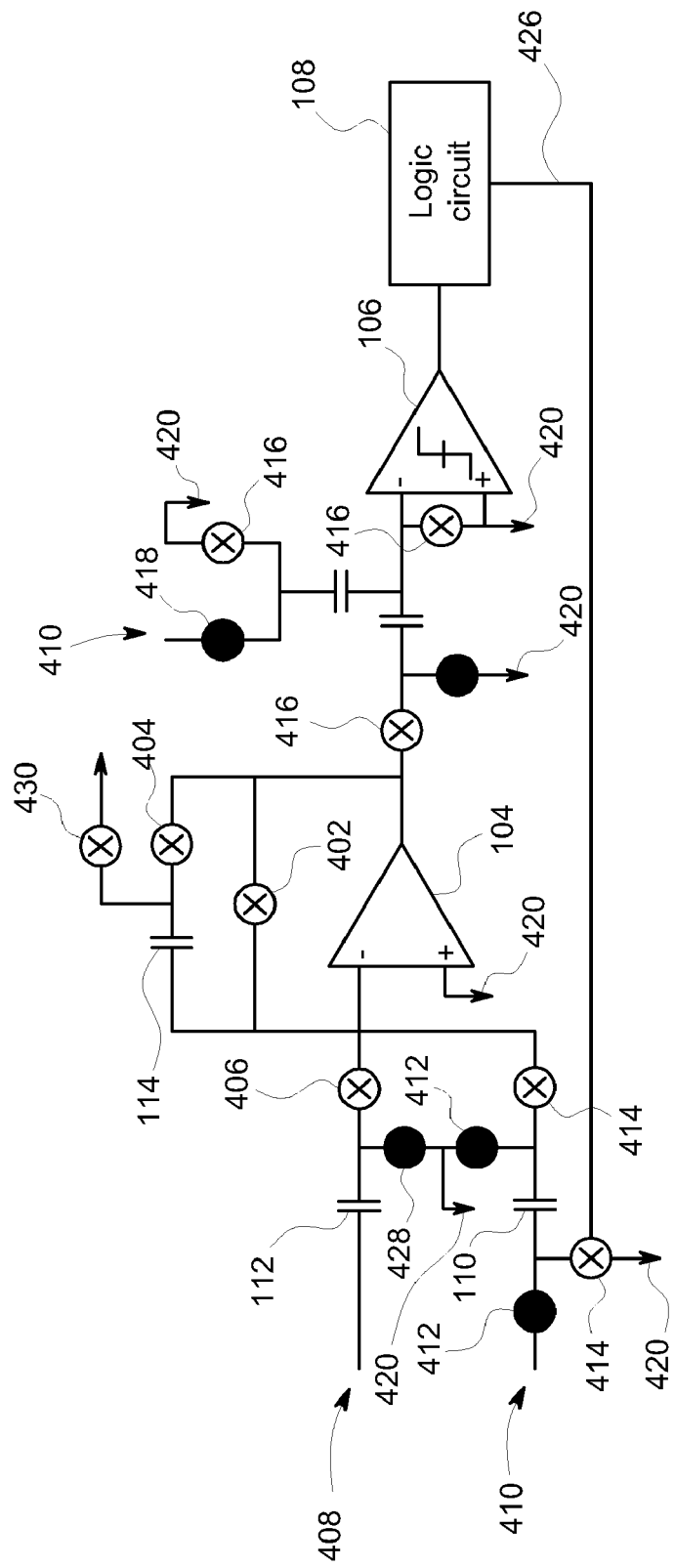
FIG. 10 is a diagram illustrating an ADC comparing a reference voltage to an input signal sample in accordance with an embodiment.

FIG. 10 illustrates the ADC 100 comparing a reference voltage (Vref) 410 to an input signal sample (Vsig) 408 in accordance with an embodiment. Thus, FIG. 10 illustrates the comparison for the SAR operation. The sample clock signal 558 turns low and the hold clock signal 560 turns high in this state. The capacitor Cdac 422 then holds the charge Vref 410. Furthermore, the sampled input signal is held in Cs 424. The comparator 106 takes as inputs Vref 410 stored in Cdac 422 and Vsig 408 stored in Cs 424 and performs a comparison. The comparator 106 then sends the signal to the logic control 108, communicating to the logic circuit 108 if the Vsig 408 is greater or less than the Vref 410 as described in more detail herein.

Figure 11:
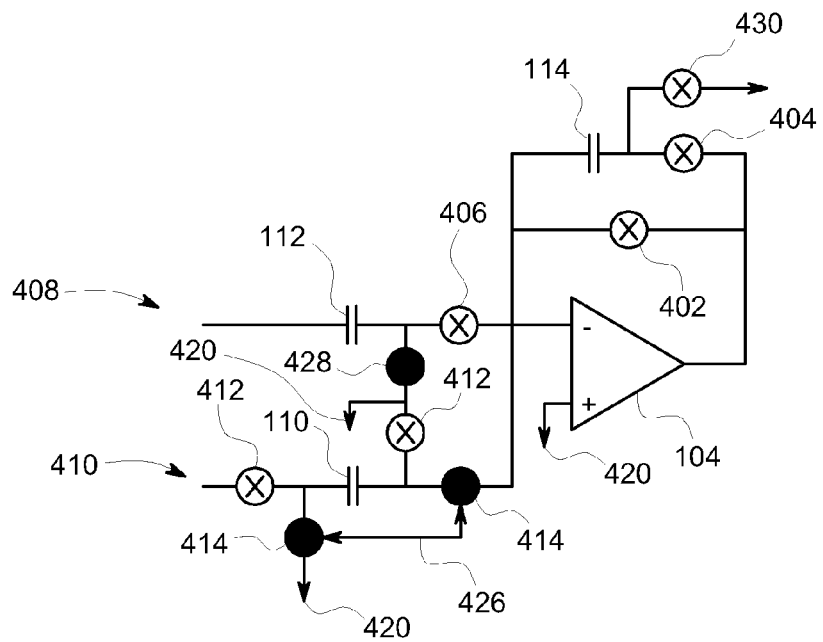
FIG. 11 is a diagram illustrating an ADC wherein an input signal sample is greater than a reference voltage in accordance with an embodiment.

FIG. 11 illustrates operation when the input signal 408 sample is greater than the reference voltage Vref 410 in accordance with an embodiment. When the input signal Vsig 408 is greater than the reference signal Vref 410, the logic circuit 108 sets the bit to 1. The high bit is communicated to the clock signal generator (not shown) which in turn changes the Sub-OSN clock signal 564 to low and the SubOS clock signal 566 to high. This causes the SubOS switch 414 to close during the gain phase. Then Vref 410 is subtracted from the Vsig 408. The capacitor Csub (not shown) stores the resulting residue signal. The SubOS switches 414 are closed and the feed back capacitor Cfb 114 is discharged (grounded). The process continues for the next clock cycle. The voltage stored in Csub (not shown) becomes the new signal voltage (Vsh). The equation representing the subtraction process for the next cycle is as follows:

$$V_{sh}(i) = V_{sh}(i-1) - V_{ref}(i-1)\left(\frac{Csub}{Cfb}\right)$$

$$D(i)=1$$

Figure 12:
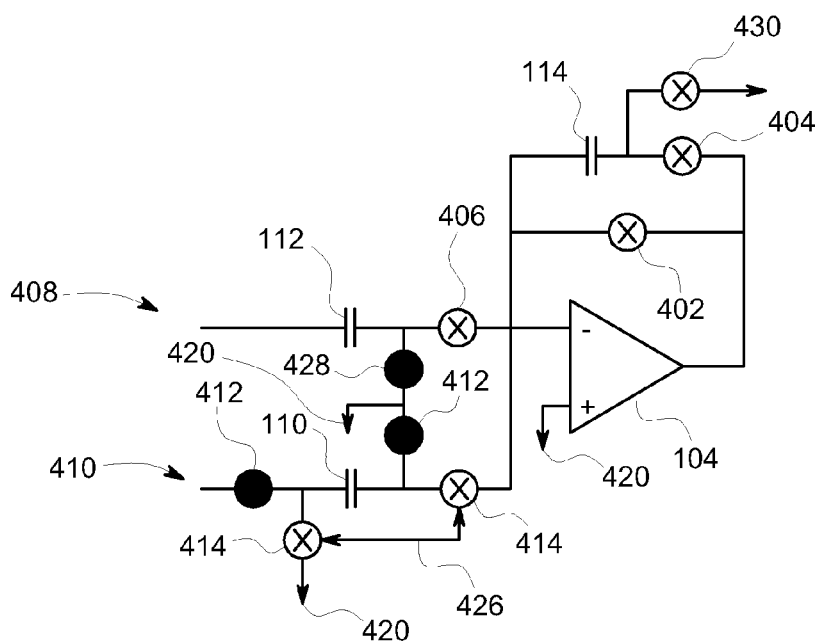
FIG. 12 is a diagram illustrating an ADC wherein an input signal sample is less than a reference voltage in accordance with an embodiment.

FIG. 12 illustrates operation when the input signal 408 sample is less than a reference voltage in accordance with an embodiment. When the input signal Vsig is less than the reference signal Vref, the logic circuit 108 sets the bit to 0. The low bit is communicated to the clock signal generator which in turn changes the SubOSN clock signal 504 to high and the SubOS clock signal 566 to low. This causes the SubOS switch 412 to open and the switch SubOSN 412 to close. The old Vref 410 signal is discharged from the capacitor Cos 110 to the ground and the next time varying reference signal is allowed to charge the capacitor. The ADC 100 does not perform any subtraction. The equation representing the process where Vsig 408 is less than Vref 140 is as follows:

$$V_{sh}(i)=V_{sh}(i-1)$$

$$D(i)=0$$

The next clock cycle is generated and the process illustrated in FIGS. 10, 11 and 12 is repeated in an iterative process. The SAR operation continues for the required number of bits in the digitization operation.

Figure 13:
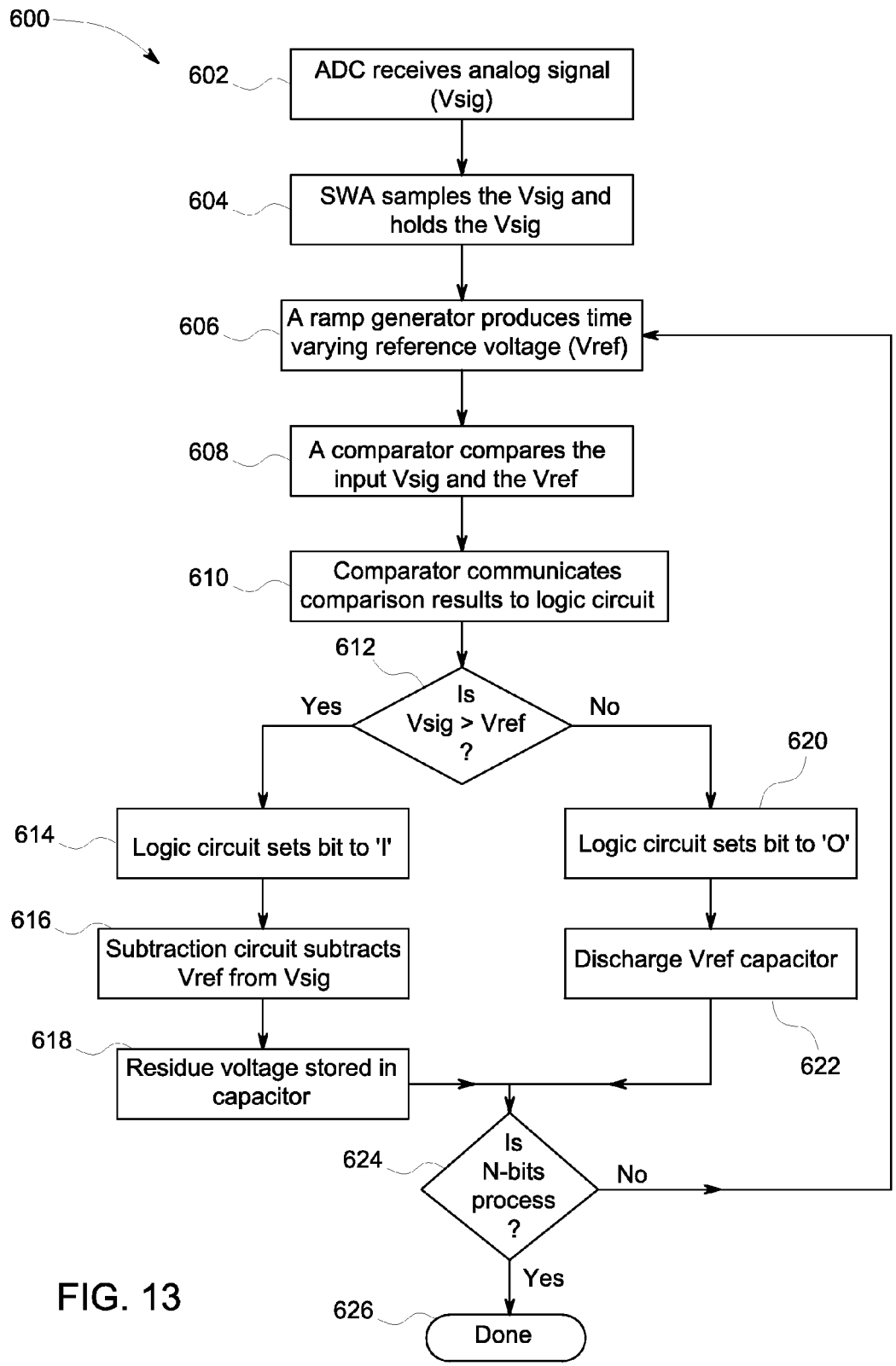
FIG. 13 is a flowchart of a successive approximation register (SAR) operation in accordance with various embodiments.

Various embodiments also provide a method 600 for performing a SAR as illustrated in the flowchart of FIG. 13. In particular, at 602 an ADC receives analog signals at an input (Vsig). For example, the signal may be from one or more CT detectors or any other form of radiation detectors. However, the signals may be from other medical or non-medical systems. Alternatively, the analog signal may be any form of continuous signal. At 604 input signal Vsig is sampled and held, for example, stored temporarily. It should be noted that SHA operations are performed in every data channel, such as by separate SHA circuits in each channel.

At 606 a time varying reference voltage (Vref) is generated by a single ramp generator and supplied to each channel via a master bias channel. For example, the time varying references may a factor of two from a previous reference signal. At 608 the input Vsig and Vref signals are compared. Thereafter, at 610 the comparison result is communicated, for example, to a logic circuit. At 612 the logic circuit uses the comparison to determine whether Vsig is greater than Vref. If the input Vsig is greater than Vref, a signal is provided, for example, the logic circuit sets a digital bit to '1' at 614. This decision bit is communicated to a clock generator that produces the appropriate clock signal to perform subtraction, for example, as described herein. Thus, at 616, subtraction is performed by, for example, a charge subtracting circuit, which may form part of an OpAmp as described herein. At 618 the residue charge after subtraction is stored, for example, in a capacitor, which also maintains a count of the number of subtraction operations performed. The residue signal at the end of 618 is used as the new Vsig. The Vref is changed by about a factor of two such that the new Vref is half of the previous Vref. However, it should be noted that other factor values may be used. The method continues to 624, which is described in moiré detail below.

Returning to 612, if the input Vsig is less than the Vref, a signal is provided, for example, the logic circuit sets a digital bit of '0' at 620. The logic circuit then communicates the decision to clock generator that produces the appropriate clock signal to perform a discharge of a capacitor holding Vref. At 622 the capacitor discharges Vref and the method continues to 624.

At 624 a determination is made as to whether all bits, for example, for N-bit digitization, have been processed. If all bits have not been processed, the method proceeds to 606. For example, in an 8-bit ADC, steps 606-624 will be performed a total eight times. The steps of 606-624 repeat and continue to the LSB of an N bit comparator in an iterative process. Thereafter, the method ends at 626.

It should be noted that the SAR operation in accordance with various embodiments may incur lower noise. The noise is generally incurred every time the switch Cos 110 is closed to subtract Vref 410. The ADC 100 incurs noise equal to sqrt(kTCos)/Cfb. However, in some embodiments, the digitization is performed only for the MSBs using the SAR operation, and the smallest signals do not suffer such noise. The smallest signals are digitized by applying a continuous linear ramp and counting the number of clock cycles it takes for the comparator to compare all N bits. The ramp generated in the ramp generator is common to all the channels. The hybrid of the SAR and the ramp based reference voltage generation reduces the calibration requirement without compromising the speed of the ADC. For example, in a CT/X-ray application, more noise is allowed at higher signals for CT/X-ray, but not for the radiation detectors. For the radiation detectors, Cos 110 may be sized such that the sqrt(N·kTCos)/Cfb<=1 LSB where N is the number of MSBs realized using successive approximation.

The various embodiments may be implemented in imaging systems to provide, for example, high speed ADC operation. A technical effect of at least one embodiment is pending an ADC that can perform at lower power, as well as reducing the area used for the physical components and crosstalk. The various embodiments are not limited to the medical field and can be used across many electronic circuits to provide, for example, offset correction design and auto-calibration.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the subject matter disclosed herein, without departing from their scope. While the dimensions and types of materials described herein are intended to define the parameters of the various embodiments of the subject matter disclosed herein, the embodiments are by no means limiting and are exemplary embodiments. Many other embodiments will be apparent to those of skill in the art upon reviewing the above description. The scope of the various embodiments of the subject matter disclosed herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments of the subject matter disclosed herein, including the best mode, and also to enable any person skilled in the art to practice the various embodiments of the subject matter disclosed herein, including making and using any devices or systems and performing any incorporated methods. The patentable scope of the various embodiments of the subject matter disclosed herein is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. An analog to digital convertor (ADC) comprising:
   a plurality of channels receiving input analog signals;
   an operational amplifier in each channel;
   a comparator connected to the operational amplifier;
   a logic circuit in each channel connected to the comparator and configured to generate an output based on a comparator signal received from the comparator;
   a ramp generator connected to the plurality of channels and configured to provide a time varying reference signal; and
   a temporary store capacitor in each of the plurality of channels having one end connected to a first switch and a second switch, and a second end connected to ground to discharge the temporary store capacitor,
   wherein the first switch, when closed to complete the circuit, receives a reference voltage from the ramp generator, the second switch, when closed to complete the circuit, passes the stored reference voltage from the temporary store capacitor to the operational amplifier.

2. The ADC of claim 1, wherein the operational amplifier further comprises a sample and hold circuit to store a sample from the input analog signal, a charge subtracting circuit to subtract a reference signal from a sample of the input analog signal, and a feedback capacitor to hold residue charge after subtraction and a counter to track a number of residue counts.

3. The ADC of claim 1, wherein the operational amplifier further comprises an amplification circuit to provide gain to at least one of a sampled analog signal or a residue signal generated from the input analog signal.

4. The ADC of claim 1, wherein the output of the ramp generator is directly applied to the comparator.

5. The ADC of claim 1, wherein the output of the ramp generator is binary weighted.

6. The ADC of claim 1, wherein said ramp generator is a resistive ladder.

7. The ADC of claim 1, wherein said ramp generator is a capacitor array.

8. The ADC of claim 1, wherein said ramp generator is a hybrid of a resistive ladder and a capacitor array.

9. The ADC of claim 1, wherein the ADC comprises a digital to analog convertor (DAC) common to all of the plurality of channels.

10. The ADC of claim 1, wherein the plurality of channels do not comprise a capacitor array per channel.

11. The ADC of claim 1, wherein the plurality of channels comprises data channels of a radiation detector for a diagnostic medical imaging system.

12. A method for converting an analog signal to a digital signal using an analog-to-digital converter, said method comprising:

receiving input analog signals at a plurality of channels;
sampling an input voltage signal in each channel from the input analog signal;
holding the input voltage signal in each channel;
iteratively producing a time varying reference voltage using a ramp generator for the plurality of channels such that the time varying reference voltage in one iteration varies from a time varying reference voltage in a subsequent iteration by a determined factor;
receiving the time varying reference voltage into a temporary store capacitor in each of the plurality of channels from the ramp generator by closing a first switch to complete a circuit;
transferring the time varying reference voltage from the temporary store capacitor to an operational amplifier by closing a second switch to complete the circuit, wherein one end of the temporary store capacitor is connected to the first switch and the second switch, and a second end of the temporary store capacitor is connected to ground to discharge the temporary store capacitor
comparing the time varying reference signal with the input analog signal;
subtracting the time varying reference signal from the input analog signal if the input analog signal is less than the time varying reference signal;
using the residue charge after subtraction as the input signal for a subsequent iteration; and
iteratively performing the steps until digitization is complete.

13. The method of claim 12, further comprising amplifying the input analog signal.

14. The method of claim 12, further comprising amplifying the residue signal.

15. The method of claim 12, further comprising generating the time varying reference voltage using a capacitor array.

16. The method of claim 12, further comprising generating the time varying reference voltage using a resistive ladder.

17. The method of claim 12, wherein the time varying reference voltage is generated using a hybrid combination of capacitor array and a resistive ladder.

18. The method of claim 12, wherein the time varying reference voltage in the subsequent iteration is less than the time varying reference voltage in a previous iteration by the determined factor.

19. The method of claim 12, wherein the input analog signal comprises a data signal from a radiation detector of a diagnostic medical imaging system.

* * * * *